US007054995B2

(12) United States Patent
Chow et al.

(10) Patent No.: US 7,054,995 B2
(45) Date of Patent: May 30, 2006

(54) DYNAMIC LINKING OF BANKS IN CONFIGURABLE CONTENT ADDRESSABLE MEMORY SYSTEMS

(75) Inventors: Nelson L. Chow, Mountain View, CA (US); Paul Cheng, San Jose, CA (US)

(73) Assignee: Integrated Silicon Solution, Inc., Santa Clara, CA (US)

( * ) Notice: Subject to any disclaimer, the term of this patent is extended or adjusted under 35 U.S.C. 154(b) by 414 days.

(21) Appl. No.: 10/249,598

(22) Filed: Apr. 23, 2003

(65) Prior Publication Data

US 2004/0215870 A1 Oct. 28, 2004

(51) Int. Cl.
*G06F 12/00* (2006.01)

(52) U.S. Cl. .......................................... 711/108; 365/49
(58) Field of Classification Search ................ 711/108; 365/49

See application file for complete search history.

(56) References Cited

U.S. PATENT DOCUMENTS

| 6,219,749 B1 * | 4/2001 | Schultz et al. ............... 711/108 |
| 6,418,042 B1 * | 7/2002 | Srinivasan et al. ............ 365/49 |
| 6,697,276 B1 * | 2/2004 | Pereira et al. ................. 365/49 |
| 6,934,796 B1 * | 8/2005 | Pereira et al. ............... 711/108 |

OTHER PUBLICATIONS

Huang, Nen-Fu and Zhao, Shi-Ming, "A Novel IP-Routing Lookup Scheme and Hardware Architecture for Multigigabit Switching Routers," IEEE Journal on Selected Areas in Communications, vol. 17, No. 6, Jun. 1999, pp. 1093-1104.*
Waldvogel et al., "Scalable High-Speed Prefix Matching," ACM Transactions on Computer Systems, vol. 19, No. 4, Nov. 2001, pp. 440-482.*

* cited by examiner

*Primary Examiner*—Pierre-Michel Bataille
(74) *Attorney, Agent, or Firm*—Raymond E. Roberts; Intellectual Property Law Offices

(57) ABSTRACT

A content addressable memory (CAM) system includes CAM banks that can be linked together in a series to form a CAM module. Each CAM bank includes a CAM array with rows. In a lookup operation, each row asserts a field-match signal when a field from a key matches the field of a CAM entry held in the row. Each CAM bank receives a link-control signal, each received from the preceding CAM bank match-in signals for the rows, and each generates match-out signals for the rows. Some embodiments dynamically configure the CAM system into one or more independent CAM modules of various widths, according to data held in a configuration register or to the current value of the key or other search information. Some embodiments include multiple priority encoders that can be coupled to the match-out signals of dynamically selected CAM banks, thus advantageously allowing parallel lookup operations in the CAM modules.

17 Claims, 10 Drawing Sheets

DYNAMIC LINKING OF BANKS IN CONFIGURABLE CONTENT ADDRESSABLE MEMORY SYSTEMS

BACKGROUND OF INVENTION

Modern society and technology are increasingly based on information or data. Data of a wide variety of types is commonly stored or held, accessed or retrieved, and modified or updated. A variety of means are used to perform such operations—means ranging from time-tested paper and ink to state-of-the-art, high-technology electronic circuits.

For example, using a 2003 telephone book that includes Santa Clara, Calif. and looking for "Integrated Silicon Solution, Inc.," one can find the phone number "(408) 588-0800." Expressed in the terminology used to describe electronic memories, the telephone book is a content addressable memory (CAM). Finding a phone number is a lookup operation that matches entries held in the CAM with the key of the lookup operation, the key being "Integrated Silicon Solution, Inc." All entries within the CAM are searched in order to find those whose content matches the key. For this lookup operation, exactly one matching entry is found and the output is the phone number associated with that entry, i.e. "(408) 588-0800."

FIG. 1a is a functional diagram of the input, output and contents of a first example content addressable memory (CAM) according to the background art. CAM 110 holds binary information, that is, information in the form of bits having one of two values, i.e. "0" or "1."

Binary CAM 110 includes four rows, each of which has an associated row number 112. Each row holds a data entry 114, which is a binary number; for example, the highest-priority or first row, that is row number 1, holds a data entry with the value of "1010." Key 120 is a binary value that is input to binary CAM 110. In response to receiving a value for key 120, binary CAM 110 produces a corresponding value for output 130.

FIG. 1b shows four example lookup operations that occur in binary CAM 110. During each lookup operation 140, binary CAM 110 receives an input key value 120, and in response generates an output value 130. In the first example lookup operation, the key value received is "1100" and the output is "3" because row number 3 is the only row whose content matches the key value, that is, is the same as the key value. In the second example lookup operation, the key value received is "1010" and the output is "1."

Both row number 1 and row number 2 match the key, but row number 1 has priority over row 2 because it has a smaller row number. Entries in a phone book are ordered alphabetically, but entries in electronic CAMs are generally ordered by priority, which is used to determine which of the matching entries to output when more than one entry matches a particular key.

In both the third and fourth example lookup operations, the output of binary CAM 110 is "Invalid" because no rows match either "1011" or "0001".

In some CAM systems, the row number output from binary CAM 110 is used as an address to be input to a standard memory, that is, a memory that holds data that is retrieved based on the address of the data within the memory. A standard memory could be used in order to hold the phone number, for example, of the entries within the CAM and to output the phone numbers of the 3rd, 1st or 4th entries based on binary CAM 110 outputting "3," "1" or "4."

FIG. 2a is a functional diagram of the input, output and contents of a second example content addressable memory (CAM) according to the background art. CAM 210 holds ternary information, that is, information in the form of bits having one of three values, i.e. "0," "1" or "either 0 or 1."

Each of the four entries held by ternary CAM 210 includes both data entry 216 and mask entry 218. Data entries 216 held in ternary CAM 210 have the same values as the data entries 116 within binary CAM 110. A bit with the value "1" within a mask entry 218 indicates that the entry held in that row "does not care about" the value of the key for that bit. For example, the entry in row 4 matches either the key value "1000" or the key value "1001".

FIG. 2b shows four example lookup operations that occur in ternary CAM 210. During each lookup operation 140, ternary CAM 210 receives as input a key value 120, and in response generates an output value 130. The example key values shown in FIG. 2b are the same as in FIG. 1b.

In the first, second and fourth example lookup operations, the outputs produced by ternary CAM 210 and the rationales for these outputs are unchanged from the example of FIGS. 1a and 1b.

However, in the third example lookup operation, the output of ternary CAM 210 is "2" because the entry in row number 2 matches either the value "1010" or the value "1011" because mask entry 218 for row 2 is "0001." This contrasts with binary CAM 110, which had no entry corresponding to a key value of "1011," and thus had an "Invalid" output.

A lookup process based on matching contents held in a CAM memory often occurs as a data packet is routed across a computer network. In fact, a data packet traveling along a complex network such as the Internet may trigger hundreds of such lookup operations. Computer networks often include switches, hubs, firewalls, gateways, concentrators or routers, which are collectively termed "routers" herein.

Consider an example in which a router receives a data packet containing part of a web page that is to be displayed on a destination computer. The router extracts from the data packet the network address of the destination computer, say for example, "87.134.242.159." Then the router uses the destination address, or part of the destination address, such as "87.134" or simply "159," as the key for a lookup operation in a CAM.

For network routing applications, the speed at which a CAM lookup operation occurs is critical. Displaying a single web page may involve tens of thousands of data packets. Hundreds of web page accesses and numerous other information streams may pass through a single router concurrently. It may be reasonable for a person to take a minute to look up a phone number, but a network router should perform many millions of CAM lookup operations each second.

For network routing applications, the flexibility of lookup operations is also critical. Thus, flexible CAM configurations are critical.

As an example of the need for flexibility, some routers use CAM lookup keys other than, or in addition to, the destination network address. Examples of data that may be included in a key include, among others, the type of the data packet, the size of the data packet, or the network address of the source of the data packet.

As another example, the network data stored in the CAM may include a wide variety of types of information. Such information may include, but is not limited to. i) network links outbound from a router over which packets are to be forwarded when addressed to a particular destination, or to a particular group of destinations; ii) priority or quality of network service information associated with a particular destination or packet type; iii) security information or access privileges; and iv) dynamically maintained load information. As yet another example of the need for flexibility, some routers vary as to the open system interconnection (OSI) layer or layers on which they operate.

Computer networks are not the only electronic devices that employ CAMs. Other applications include data storage networks and systems, video processing, computer graphics and data compression.

Some background-art CAM systems offer high speed by implementing lookup operations as actions that occur simultaneously in parallel hardware. However, hardware implementations tend to be relatively inflexible. Other background-art CAM systems offer flexibility by implementing lookup operations as programmable sequences of actions under the control of software or firmware. However, programmable implementations tend to have relatively low performance.

SUMMARY OF INVENTION

Thus there is a need for content addressable memory (CAM) systems that are both high in speed and flexible in content and operation. The invention meets this need by providing hardware CAM banks that can be dynamically linked together in various configurations. Some embodiments of the invention provide configurable interconnections among such linked CAM banks, which advantageously allows the width of the entries and keys supported by the CAM system to be changed dynamically. Some embodiments provide CAM systems that can be configured into two or more CAM memories that can perform lookup operations at the same time, thus advantageously providing a potential system speedup of two or more times.

A CAM system according to some embodiments of the invention includes a CAM module having a series of CAM banks, where the series is configured according to a corresponding series of link-control signals. Each CAM bank has a control circuit and a CAM array. Each row of the CAM array holds a field from one of the entries held in the CAM module, receives a corresponding field from the key, determines if the entry field matches the key field and, if so, asserts a field-match signal. The control circuit receives the field match signal for each row, a match-in signal for each row and a link-control signal, and generates a match-out signal for each row. The match-in signals received by all but the first CAM bank in the series are the match-out signals from the corresponding rows within the preceding CAM bank in the series.

Some embodiments of the invention include multiple priority encoders and an interconnect circuit that couples the match-out signals of a selected one of the CAM banks to each priority encoder.

Some embodiments of the invention include a configuration register that holds configuration information and generates various configuration control signals based thereon. Additionally or alternatively, configuration control signals may be generated based on the key.

Some embodiments of the invention include a method of generating an output value based on entries, where each entry includes entry fields, and each entry field is held in one of a series of CAM banks. A key is received and partitioned into a series of key fields, where each key field corresponds to one of the CAM banks. Each key field is compared with the entry fields held in the CAM bank that corresponds to the key field. For each entry and for each CAM bank, a field match signal is generated, based on the comparing. For each entry, a series of partial-match signals is generated, wherein the series of partial-match signals corresponds to the series of CAM banks and each partial-match signal represents the status of the field-match signal for the corresponding entry and for the corresponding CAM bank and for any CAM banks that precede the corresponding CAM bank in the series. An entry whose partial-match signal is asserted by the CAM bank that is last in the series is selected and encoded.

BRIEF DESCRIPTION OF DRAWINGS

Objects, features and advantages of the invention will become apparent from the descriptions and discussions herein, when read in conjunction with the drawing. Technologies related to the invention, example embodiments of the invention, and example uses of the invention are illustrated in the various figures of the drawing, which are as follows.

DETAILED DESCRIPTION

The descriptions, discussions and figures herein illustrate technologies related to the invention, show examples of the invention and give examples of using the invention. Known methods, procedures, systems, circuits, or elements may be illustrated and described without giving details so as to avoid obscuring the principles of the invention. On the other hand, details of specific embodiments of the invention are presented, even though such details may not apply to other embodiments of the invention.

Some descriptions and discussions herein use abstract or general terms including but not limited to match, equal, assert, "true" or "false". Those skilled in the art use such terms as a convenient nomenclature for components, data or operations within a computer, digital or electromechanical system. Such components, data and operations are represented by physical properties of actual objects including but not limited to electronic voltage, magnetic field and optical reflectivity. For example, "asserted" or "true" may refer to an electronic signal that is around 3 volts and "not asserted" or "false" may refer to a signal around 0.3 volts, or visa versa. Similarly, perceptive or mental terms including but not limited to determine, select, detect, compare and control may also refer to such components, data or operations or to manipulations of such physical properties.

Figure 3:
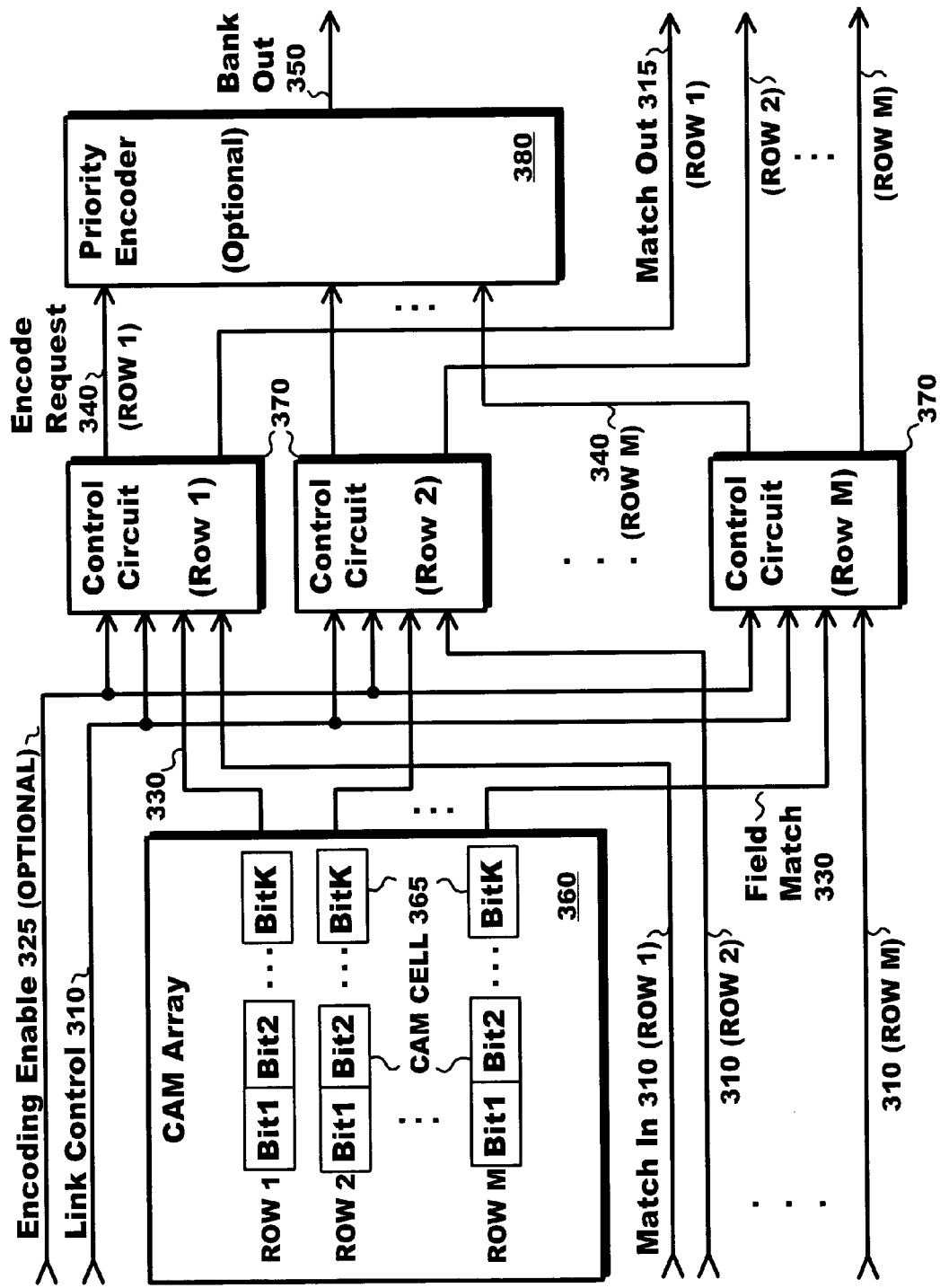
FIG. 3 shows the functional components and their interconnections for an exemplary CAM bank used in the invention.

FIG. 3 is a functional block diagram of a CAM bank according to an embodiment of the invention. CAM bank 300 is configured so that multiple instances of the bank can be linked together in a series. Each series of CAM banks operates as a single CAM module that holds entries and that performs a lookup operation based on a key.

A CAM memory system comprising multiple instances of CAM bank 300 can be configured into one or more CAM modules each having a configurable size. Such a CAM memory system can advantageously support variable width data and various types of data.

CAM bank 300 includes CAM array 360 of width K and depth M. The CAM array comprises M rows, which are numbered from 1 to M. Each row includes K instances of CAM cell 365. Each row can hold a K-bit wide field of an entry. Each row compares the entry field with a K-bit field of the key of the current lookup operation. When the current values of two fields match, then each row asserts field-match signal 330, that is, it generates the value "true" for the signal.

For each row of CAM array 360, control circuit 370 receives a match-in signal 310 and generates a match-out signal 315. The control circuit also receives link-control signal 320. The link-control signal determines which banks are linked into a series, and thus function together as a CAM module. That is, the CAM banks 300 within a CAM system are arranged in one or more long mega-series of banks that can be separated into smaller series of CAM banks that function together as a single CAM module. Different values of link-control signal 320 are supplied to various instances of CAM bank 300 depending on whether a particular bank is the first CAM bank in a series that forms a CAM module, the last CAM bank in a module, or a middle bank.

Priority encoder 380 may optionally be included in each CAM bank 300. Alternatively, a series of CAM banks that function together as a CAM memory system may have a single priority encoder coupled to the CAM bank that is the last in the series.

Priority encoder 380 receives an encode-request signal 340 corresponding to each row of CAM array 360 and generates bank-output signal 350 based on the encode-request signals. If only one of encode-request signal is asserted, then the row number of that signal is the value of bank-output signal 350. However, more than one entry held in a CAM memory system may match the key used in a particular lookup operation, in which case priority encoder 380 selects the row with the highest priority among those rows that have asserted encode-request signals, for example, the row with the lowest row number, or the row with the highest row number.

The priority encoder used in various embodiments of the invention may be any circuit or device that receives encode-request signals, that selects among those that are asserted, and that encodes the selected row. Any technique may be used to perform the selection. Any technique may be used to perform the encoding.

The control circuit used in various embodiments of the invention use various techniques to encode the link-control or configuration information. For example, link-control signal 320 may be a not-first-bank signal, or an enable-incoming link signal. Such a signal not asserted, or "false," for the first bank of each series, and is asserted for every bank that is to be linked with the preceding bank. In this case, the incoming match-in signals 310 are taken into account in generating the outgoing match-out signals 315 only when the link-control signal is asserted.

As another example, link-control signal 320 may be a last-bank signal or a disable-outgoing-link signal that is asserted for banks that are last in a CAM module and thus are not to be linked with the subsequent bank in the mega-series. Such a signal is not asserted for the first and middle banks in a CAM module. In this case, the outgoing match-out signals 315 are asserted when link-control signal 320 is asserted, regardless of what matches are within the CAM module.

Other link-control signals may be used in various embodiments of the invention, including but not limited to: a first-bank signal, a disable-incoming link signal, a not-last bank signal, or an enable-outgoing-link signal.

CAM array 360 and CAM cell 365 may be any circuit or that can hold entry fields and generate field-match signals based on comparing the entry-field value held with the value of a key field. Numerous designs for and variation on memory arrays and CAM cells are known in the art and more are likely to be developed.

Figure 1A:
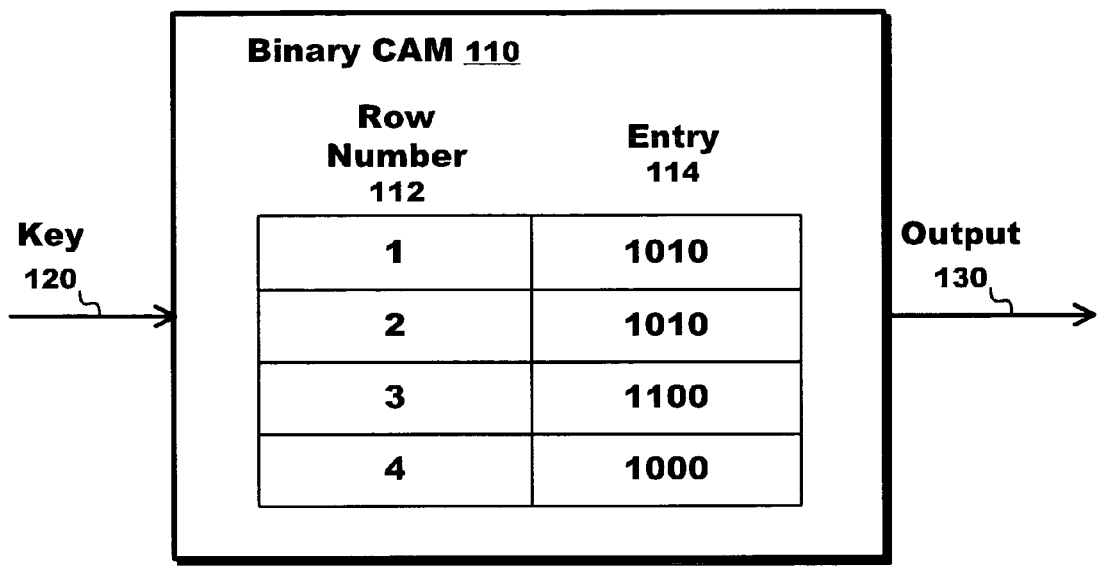
FIG. 1a shows a first example of a content addressable memory (CAM), which holds binary information.
Figure 1B:
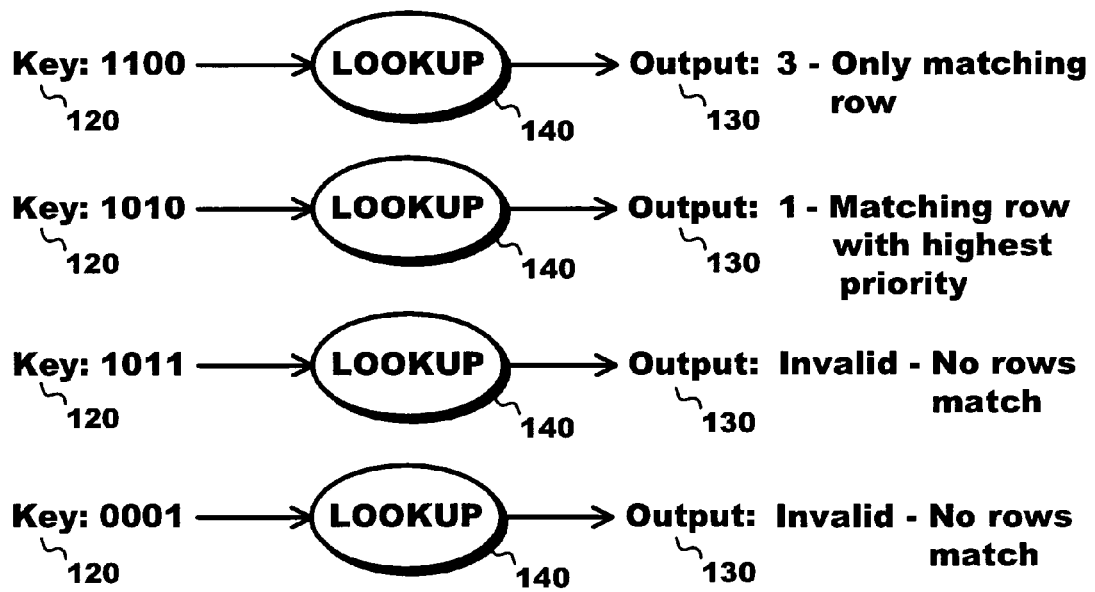
FIG. 1b shows some examples of lookup operations in the binary CAM of FIG. 1a and the output that results from the operations.
Figure 2A:
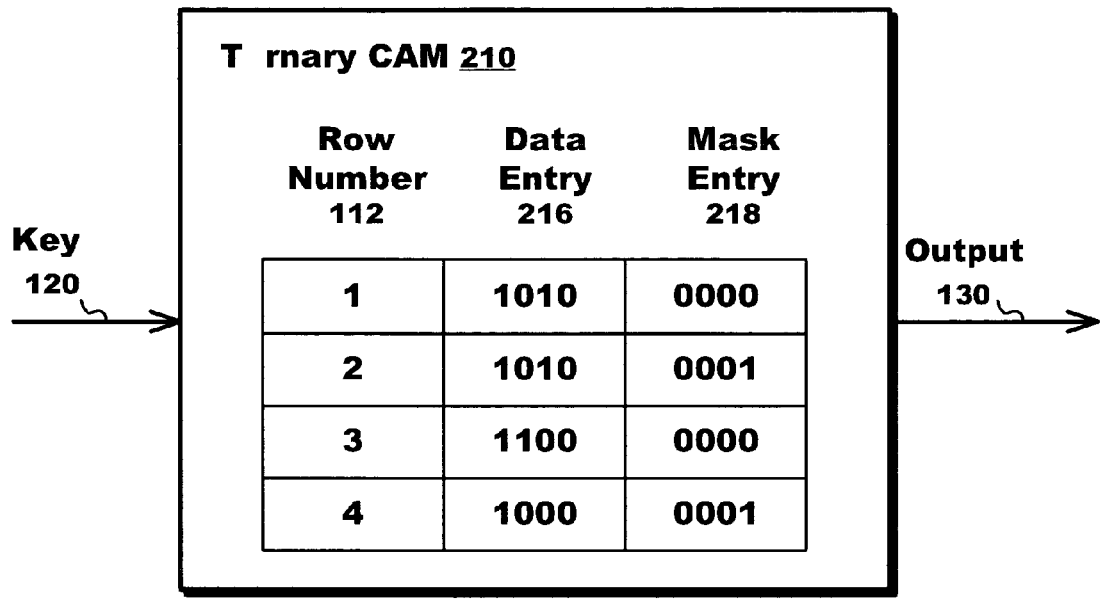
FIG. 2a shows a second example of a content addressable memory (CAM), which holds ternary information.
Figure 2B:
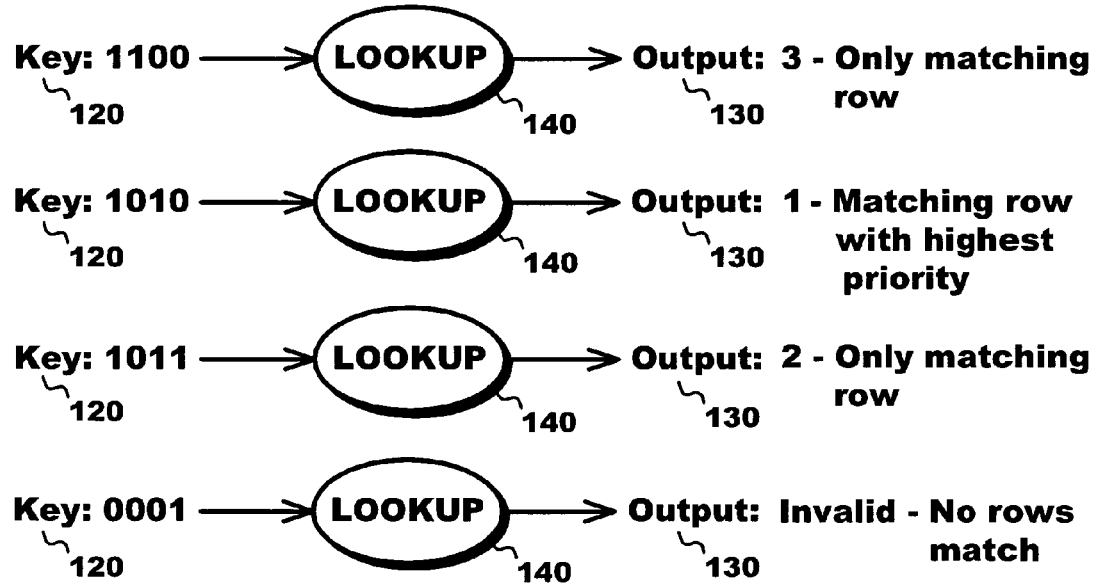
FIG. 2b shows some examples of lookup operations in the ternary CAM of FIG. 2a and the output that results from the operations.

A binary CAM, as described with regard to FIGS. 1a and 1b above, is used in some embodiments of the invention. A ternary CAM, as described with regard to FIGS. 2a and 2b above, may be used. Other types of CAM may also be used, including but not limited to: ternary CAMs where the entry held is binary and the key is ternary; ternary CAMs where both the entry held and the key are ternary; and binary/ternary CAMs that are configurable either to hold a binary entry and to determine that the key field and the entry field match based on a binary determination, or to hold a ternary entry and to determine the key field and the entry field match based on a ternary determination.

Known CAM arrays and CAM cells use various techniques to store information into the CAM, to read out information from the CAM and to modify or rearrange information in the CAM. Any of these techniques as well as techniques, CAM cells and CAM arrays developed in the future may be used in various embodiments of the invention.

The control circuit may optionally receive encoding-enable signal 325 and not assert any encode-request signals unless the encoding-enable signal is asserted. Encoding-request signal 325 is not required if there is no priority encoder associated with the CAM bank, Encoding-request signal 325 is also not required if there is no need to reduce the power consumed by the priority encoder when the CAM bank is not the last bank in the series of CAM banks.

Figure 4A:
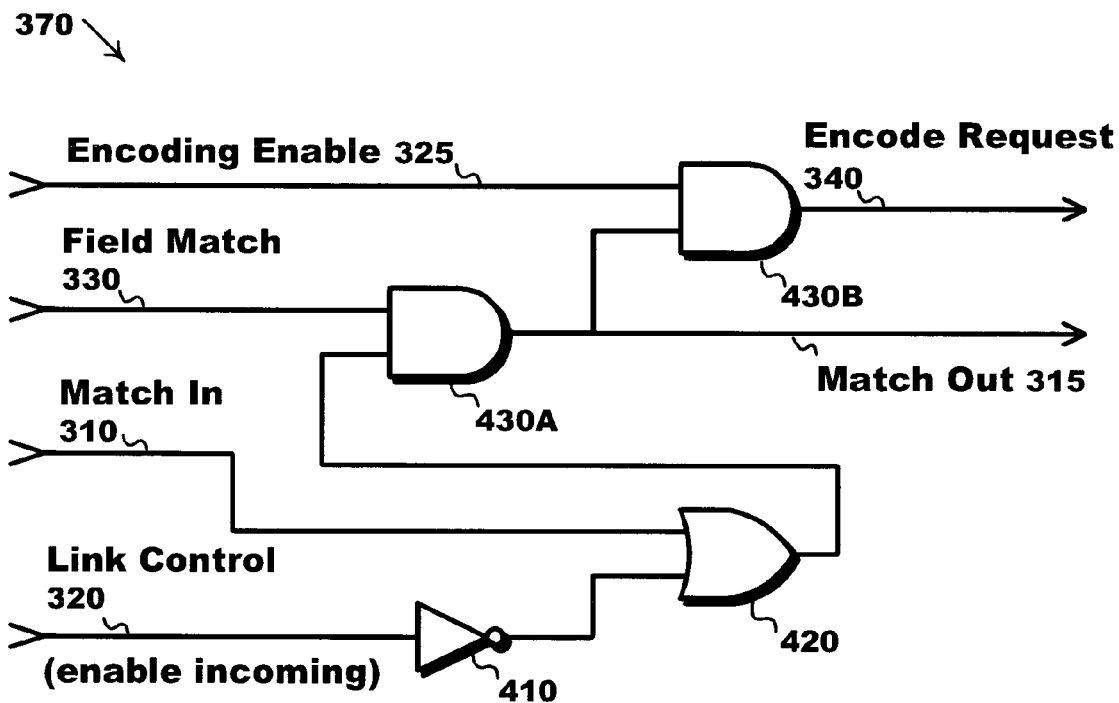
FIGS. 4a and 4b show the logical components and their interconnections for two examples of control circuits according the invention.
Figure 4B:
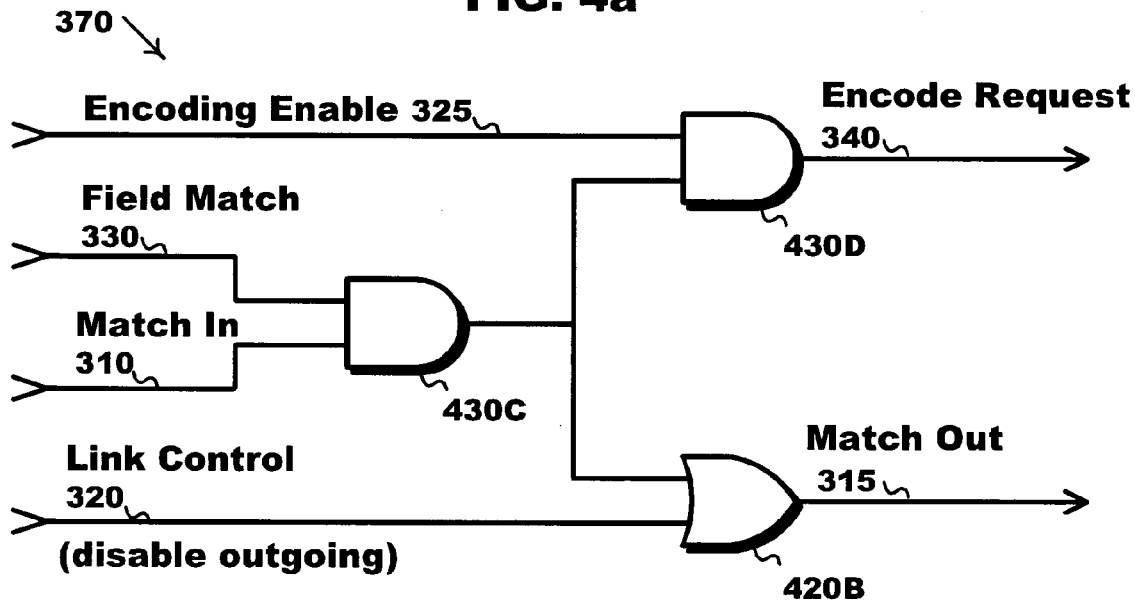

Each of FIG. 4a or 4b show a control circuit according to an embodiment of the invention. FIG. 4a is suitable for embodiments of the invention that use a not-first-bank signal, or an enable-incoming link signal as link-control signal 320. FIG. 4b is suitable for embodiments in which the link-control signal is a last-bank signal or a disable-outgoing-link signal.

In the case of FIG. 4a, link-control signal 320 is not asserted for the first bank of each series, which is not to be linked with the bank that precedes it in the mega-series. The link-control signal is asserted for the middle and last banks in each series, that is, for every bank that is to be linked with the preceding bank. This type of link-control signal is used below in FIGS. 5 and 6.

In this case, when the link-control signal is not asserted then the match-out signal generated for each row is the field-match signal of that row. When the link-control signal is asserted then the match-out signal generated for each row is asserted only if both the match-in signal and the field-match signal of that row are asserted.

AND gate 430A asserts match-out signal 315 when field-match signal 330 is asserted and either match-in signal 310 is asserted or link-control signal 410 is not asserted. OR gate 420 generates an input to AND gate 430A from match-in signal 310 and the output of inverter 410, which is driven by link-control signal 320.

AND gate 430B asserts encode-request signal 340 when both match-out signal 315 and encoding-enable signal 325 are asserted. Thus, no row has an asserted encode-request signal when the encoding-enable signal is not asserted. This technique is suitable for putting the priority encoder into a reduced power mode when circuitry such as complementary metal oxide silicon (CMOS) is used. Most of the power consumption occurs in CMOS circuits when signals transition between values. Thus, simply holding all inputs to the priority encoder at a constant value substantially reduces the power consumed by a CMOS priority encoder.

Other embodiments of the invention may use other techniques to reduce the power consumed by priority encoders that are not within the CAM bank that is last in the series of banks. The power supplied to such priority encoders may be reduced or turned off, or the clocks supplied may be turned off.

In the case of FIG. 4b, link-control signal 320 is asserted for the last bank of each series, which is not to be linked with the bank that follows it in the mega-series. The link-control signal is not asserted for the first and middle banks in each series, that is, for every bank that is to be linked with the subsequent bank. This type of link-control signal can simplify the design of some CAM systems, in which the same signal is to be used both for link-control signal 320 and for encoding-enable signal 325.

In this case, the outgoing match-out signals 315 are asserted when link-control signal 320 is asserted, regardless of what matches are within the CAM module that includes the bank that receives an asserted link-control signal. When link-control signal 320 is not asserted, then the match-out signal generated for each row is asserted only if both the match-in signal and the field-match signal of that row are asserted.

AND gate 430D asserts encode-request signal 340 when all three of encoding-enable signal 325, field-match signal 330, and match-signal 310 are asserted. AND gate 430C generates an input to AND gate 430D from field-match signal 330, and match-signal 310. OR gate 420B asserts match-out signal 315 when either link-control signal 320 or the output of AND gate 430C is asserted.

While FIGS. 4a and 4b are drawn as logic diagrams of control circuit 370, each is best interpreted as a functional diagram or a logical specification of the circuit. In various embodiments of the invention, the control circuit may be implemented with NAND gates and NOR gates, or may provide clocked or synchronous operation by latching the field-match signals to form the encode-request signals, or may use other techniques.

Latching the field-match signals can advantageously increase the throughput of a CAM memory system that has a pipelined configuration, by allowing portions of multiple lookup operations to be performed in different stages of the pipeline at the same time. Additionally or alternatively, latching the field-match signals can advantageously allow portions of keys to be read into CAM banks during different clock cycles, as described with regard to FIG. 9 below.

Figure 5:
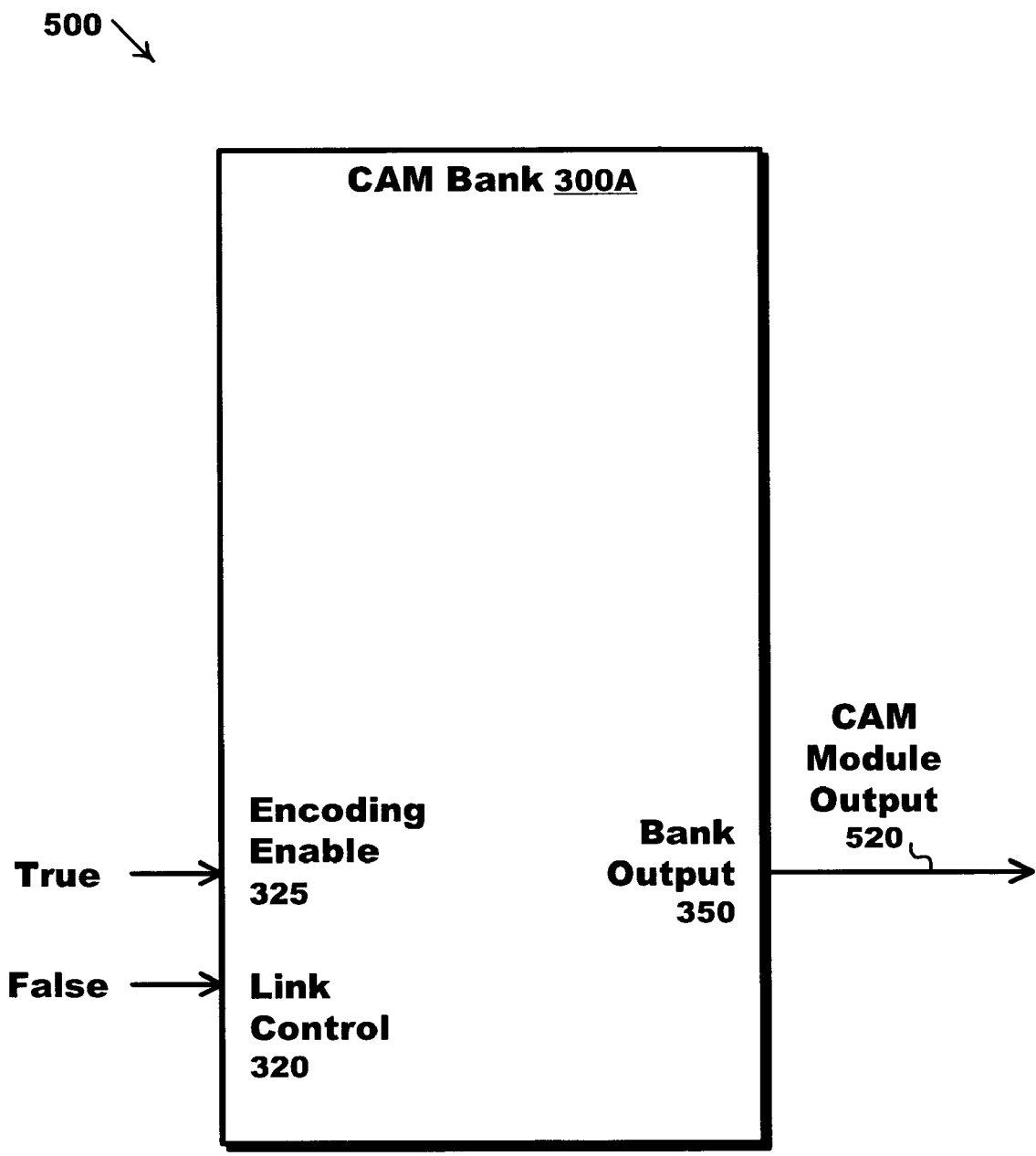
FIG. 5 shows an example of the invention in which a single instance of the CAM bank of FIG. 3 is configured to operate in a stand-alone manner as a CAM module.

FIG. 5 is a functional block diagram of a CAM module according to an embodiment of the invention. CAM module 500 includes a single instance, 300A, of CAM bank 300 of FIG. 3 that uses control circuit 370 of FIG. 4a and that is configured to operate in a stand-alone configuration.

The output of CAM module 500 is CAM module output 520, which is bank output 350 of CAM bank 300A. The encoding-enable signal 325 supplied to CAM bank 300A is asserted, thus enabling priority encoder 380 within the CAM bank to generate values on bank output 350. The link-control signal 320 supplied to CAM bank 300A is not asserted, or has the value "False," thus the encode-request signals 340 supplied to priority encoder 380 are simply the field-match signals 330 generated by CAM array 360, regardless of what values may be present on match-in signals 310.

Figure 6:
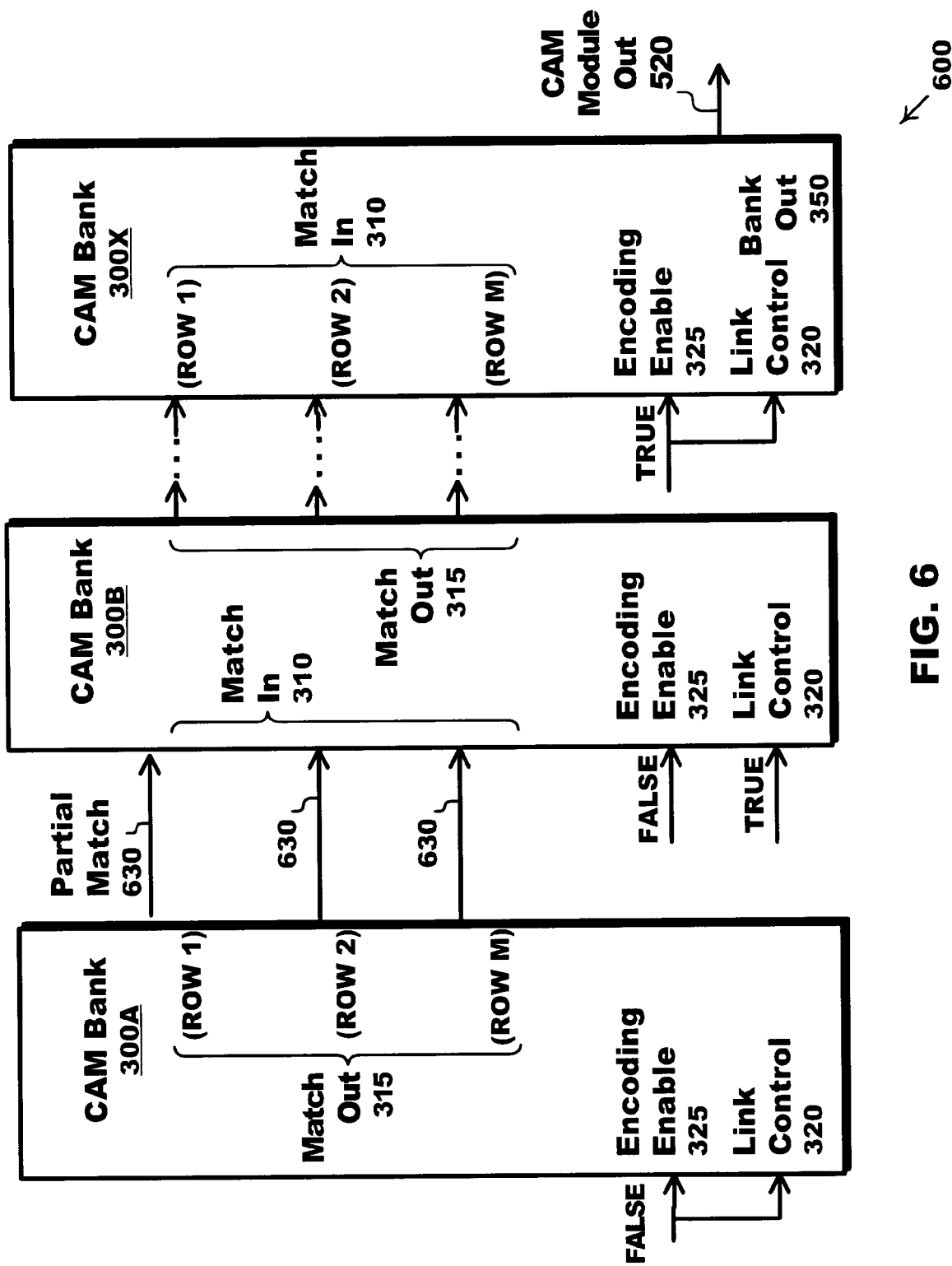
FIG. 6 shows another example of the invention in which three or more of the CAM banks of FIG. 3 are configured to operate together as a single CAM module.

FIG. 6 is a functional block diagram of a CAM module, according to an embodiment of the invention. CAM system 600 can hold and compare data that has three or more times the width of the CAM banks that are used. CAM module 600 includes three or more instances, 300A, 300B . . . 300X, of CAM bank 300, as shown in FIG. 3, each of which use control circuit 370 of FIG. 4a. CAM banks 300 are connected in a series and operate as a single CAM module. The output of CAM module 600 is CAM module output 520, which is bank output 350 of CAM bank 300X.

The last CAM bank in the series, i.e. CAM bank 300X, receives a "True" or asserted value for encoding-enable signal 325. The other CAM banks in the series receive a "False" or not asserted value for this signal. This reduces the power that is consumed in the priority encoders within the CAM banks that are not the last bank, without altering the functionality of CAM module 600.

The first CAM bank in the series, i.e. CAM bank 300A, receives a "False" or not asserted value for link-control signal 320. Thus, if any values are received on match-in signals 310 of the first CAM bank then such signals are ignored. The other banks, i.e. CAM banks 300B to 300X, receive a "True" or asserted value for link-control signal 320. Thus, the match-out signals of those banks represent both the match status within that bank and the match-in signals received by that bank.

Match-out signals 315 from all but the last CAM bank in the series, i.e. all but CAM bank 300X, propagate as partial-match signals 630 to the next CAM bank in the series to become match-in signals 310 received by that bank. For example, the match-out signal generated by CAM bank 300A for each row becomes the partial-match signal for that row that propagates to CAM bank 300B, where it becomes the match-in signal for that row within CAM bank 300B. Each pair of CAM banks 300 that are adjacent in the series of banks have partial-match signals 630 running between the pair of banks. The match-out signals 315 of each CAM bank represent the matching status of that row that is cumulative both within that bank and within any preceding banks.

A CAM module having twice the data width of CAM bank 300 can be implemented by simply connecting a CAM bank with encoding-enable and link-control signals that are not asserted directly to a CAM bank with encoding-enable and link-control signals that are asserted.

Typically, CAM banks 300 are separate instances of circuits that have the same design, but this is not necessary.

Variations may exist in one or more of the field or data width K of the bank, the row depth M of the bank, or numerous other design parameters.

Figure 7:
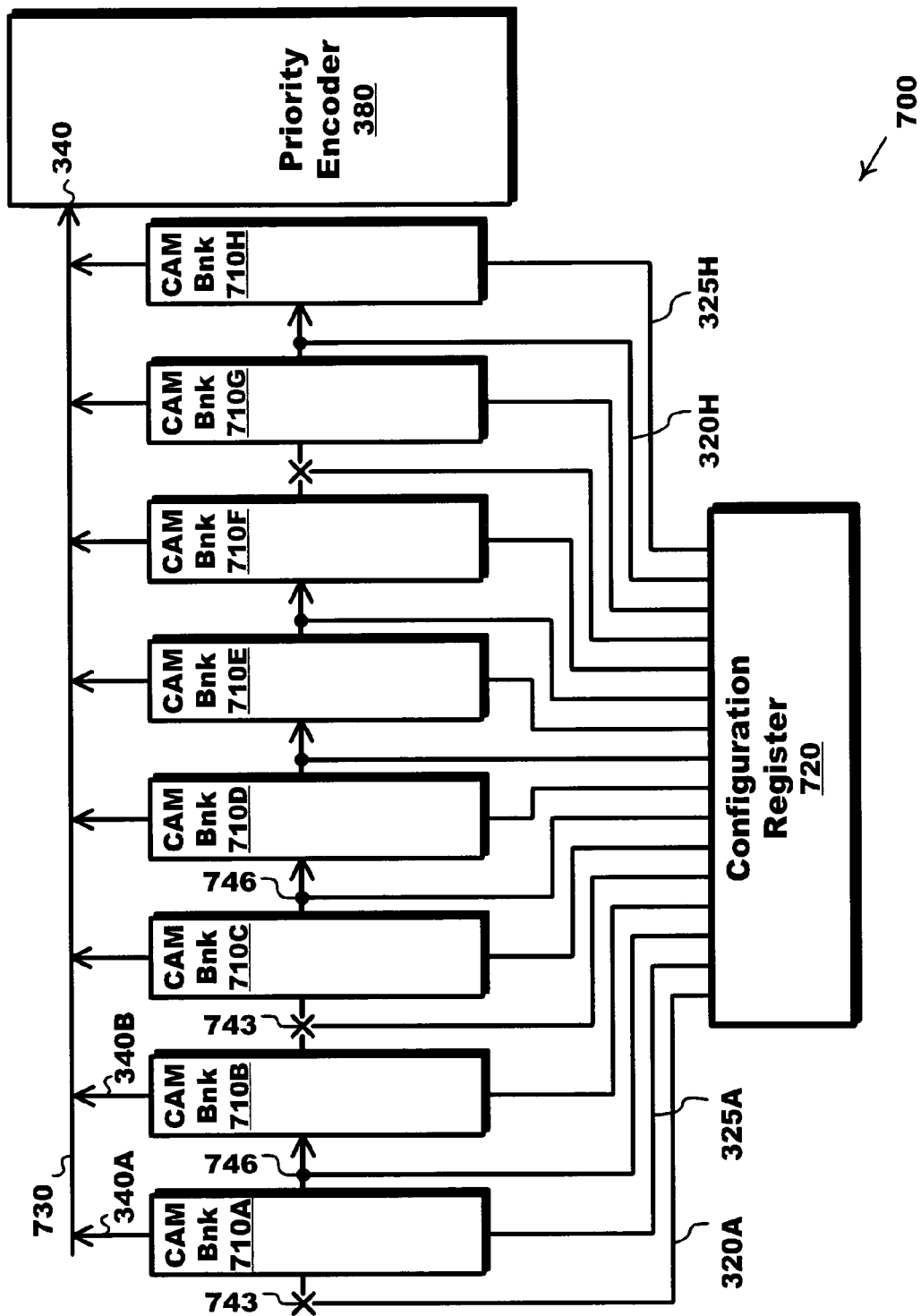
FIG. 7 shows yet another example of the invention in which CAM banks can be configured dynamically to operate together as a single CAM system that can be configured to hold data that varies in width.

FIG. 7 is a functional block diagram of a dynamically configurable CAM system according to an embodiment of the invention. CAM system 700 includes eight CAM banks 710, priority encoder 380 and configuration register 720.

In CAM system 700, both the link-control signals 320A to 320H and the encoding enable signals 325A to 325H that are provided to CAM banks 710A to 710H are generated from configuration register 720. The value held in the configuration register, and thus which banks are linked, can be changed dynamically, that is, while CAM system 700 is operating, by writing configuration data into configuration register 720.

For some applications, dynamically changing the configuration of CAM system 700 while CAM entries are held within the system requires erasing, modifying or replacing some or all of the entries held in the CAM banks that are newly linked together or newly unlinked. However, this depends on the data being held and is not a requirement imposed by CAM system 700.

Figure 8:
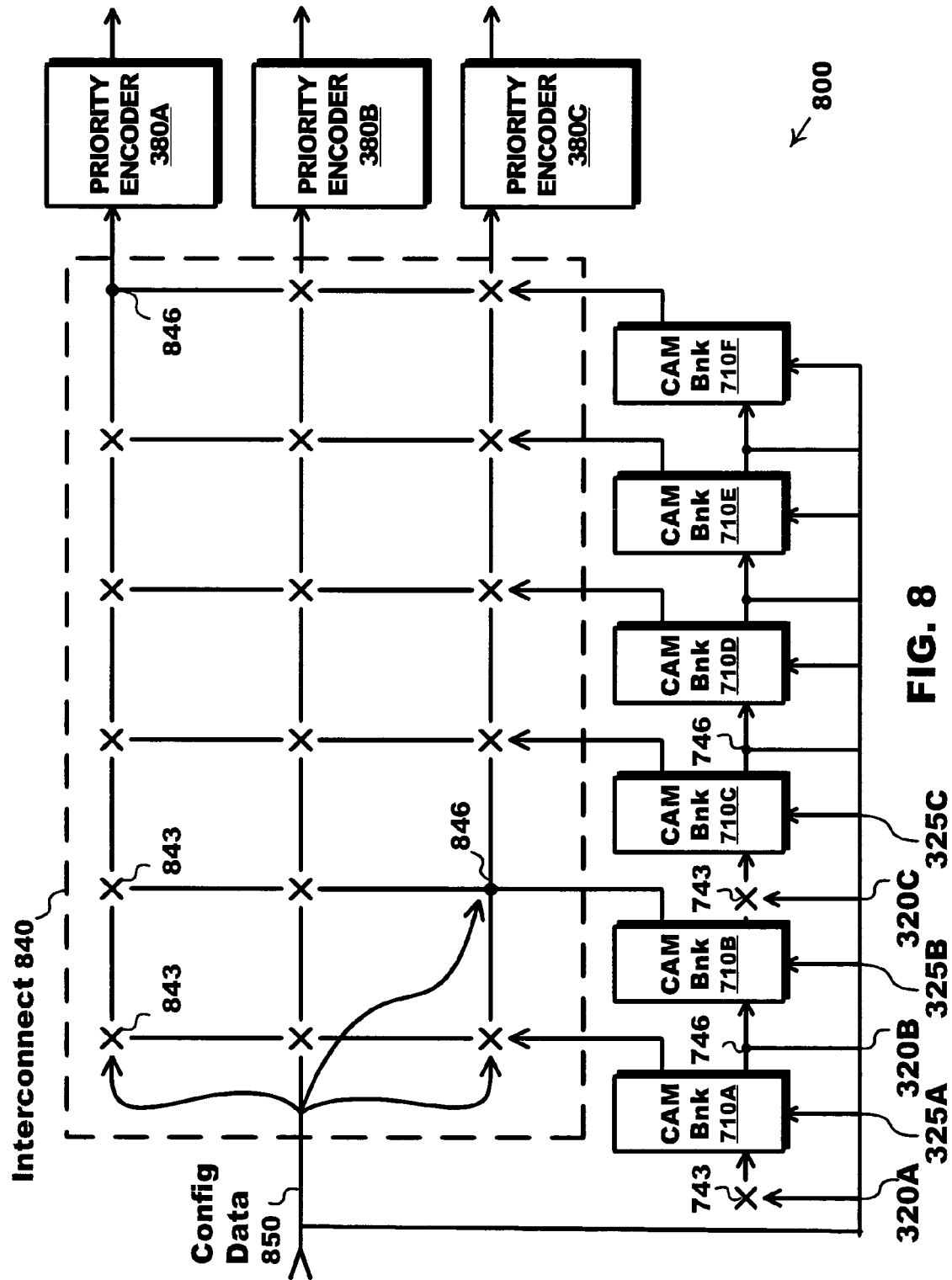
FIG. 8 shows an example of the invention in which CAM banks can be configured dynamically as one or more CAM modules that operate at the same time.

Disconnected bank links 743 are represented as an "X" and connected bank links 746 are represented as a dot in FIGS. 7 and 8. The version of control circuit 370 that is shown in FIG. 4a is used in CAM banks 710. Thus, disconnected bank links 743 occur at the input side of a CAM bank when the link-control signal 320 provided to that CAM bank is not asserted and connected bank links 746 occur at the input side of a CAM bank that receives an asserted link-control signal.

In the example configuration shown in FIG. 7, CAM banks 710 are configured into three series of CAM banks, and thus are configured to operate as three independent CAM modules. There are three instances of CAM banks 710 that have link-control signals that are not asserted. CAM banks 710A and 710B are linked and operate together as a first CAM module. CAM banks 710C to 710F are linked and operate together as a second CAM module. CAM banks 710G and 710H are linked and operate together as a third CAM module. Each series of CAM banks operates as an independent CAM module, although only one lookup operation among the three modules may occur at any one time because the three modules share a single priority encoder 380.

The configuration of CAM memory system 700 depends on the data held in configuration register 720. This data can be altered to form more CAM modules within CAM memory system 700, or to form fewer CAM modules. This data can be altered to form a CAM module that links fewer CAM banks, where such a system is limited to handling data that has less width. Alternatively or additionally, the data in configuration register 720 can be altered to form a CAM modules that links more CAM banks, where such a system is capable of handling wider data.

In the embodiment of the invention shown in FIG. 7, each CAM bank 710 differs from CAM bank 300 in that it does not include a priority encoder. However, various embodiments can include CAM banks having various features and properties, including but not limited to banks that include priority encoders, or that include other versions of control circuits.

An encoding-enable signal 325 for each instance of CAM bank 710 is used to avoid conflicts on bus 730. Bus 730 connects together the encode-request signals 340 that are output by each CAM bank 710. Bus 730 couples these signals to the encode-request signals 340 that is input to priority encoder 380.

The values of encoding-enable signals 325 are controlled by the data in configuration register 720. The data in configuration register should be set such that only one instance of CAM bank 710 drives bus 730 at a time. This data should also be set such that bus 730 is driven only the last of CAM bank 710 in a series. Thus for the configuration shown in FIG. 7, the data in configuration register 720 should ensure that exactly one of CAM banks 710B, 710F or 710H receives an asserted encoding-enable signal 325 and that no other CAM bank receives an asserted encoding enable signal.

FIG. 8 is a functional block diagram of a dynamically configurable, parallel-lookup CAM system according to an embodiment of the invention. CAM system 800 includes six CAM banks 710, three priority encoders 380, and interconnect 840.

In the example configuration shown in FIG. 8, CAM banks 710 are configured into two series of CAM banks thus forming two independently functioning CAM modules. However, this configuration can be changed dynamically by providing different values for configuration data 850.

Interconnect 840 is configurable to connect the encode-request output signals 340 from any one of CAM banks 710A to 710F to the encode-request input signals 340 of any one of priority encoders 380A to 380C. Which connections are made is controlled by configuration data 850.

A disconnected interconnect link 843 is shown in FIG. 8 as an "X," and represents that the CAM bank 710 that corresponds to the link is not coupled to the priority encoder 380 that corresponds to the link. A connected interconnect link 846 is shown in FIG. 8 as a dot. Connected interconnect links 846 represent that the encode-request signals 340 that are output by the corresponding CAM bank 710 are coupled to the encode-request signals 340 that are input to the corresponding priority encoder 380.

As shown in the example of FIG. 8, there two series of CAM banks. CAM banks 710A and 710B are linked together and are linked to priority encoder 380C. These banks and encoder operate together as a first CAM module. CAM banks 710C to 710F are linked together and are linked to priority encoder 380A. These banks and encoder operate together as a second CAM module. Thus, CAM memory system 800 operates as two independent CAM modules. Each CAM module includes one or more CAM banks and one priority encoder. Thus, each CAM module can perform independent lookup operations at the same time.

Configuration data 850 may be provided by a configuration register similar to configuration register 720 of FIG. 7. Such embodiments of the invention provide CAM modules that can be configured dynamically, that is, their configuration changes whenever the value in the configuration register changes. Typically but not necessarily, this value would be programmable under the control of software or firmware.

Alternatively or additionally, configuration data 850 may depend on the value of the search input of the current lookup operation. The search input of a particular lookup operation includes the key used in that operation, and may also include additional search information that is provided along with the key. The configuration data may include a field extracted from the key, a field extracted from the search information or both. The configuration data may also include the result of using the key, the search information, or both in arithmetical processing, logical processing, lookup operations in CAM modules, or access operations in a regular memory. Embodiments of the invention that use such configuration data also provide CAM modules that can be configured dynamically, but in these embodiments the CAM module configuration is dynamic in the sense that the configuration is data dependent.

In various embodiments of the invention, the configuration data used may come from various sources and different bits within the configuration data may come from different sources. Sources for the configuration data include but are not limited to: one or more configuration registers, and one or more data values that depend on the search input of the current lookup operation, one or more data values that are independent of the current lookup operation; or any combination thereof.

In CAM system 800, the structure and function of CAM banks 710, and of the encoding enable signals 325 and the link-control signals 320 provided to these banks are equivalent to what was described above with respect to CAM system 700 as shown in FIG. 7 and CAM bank 300 as shown in FIG. 3.

Figure 9:
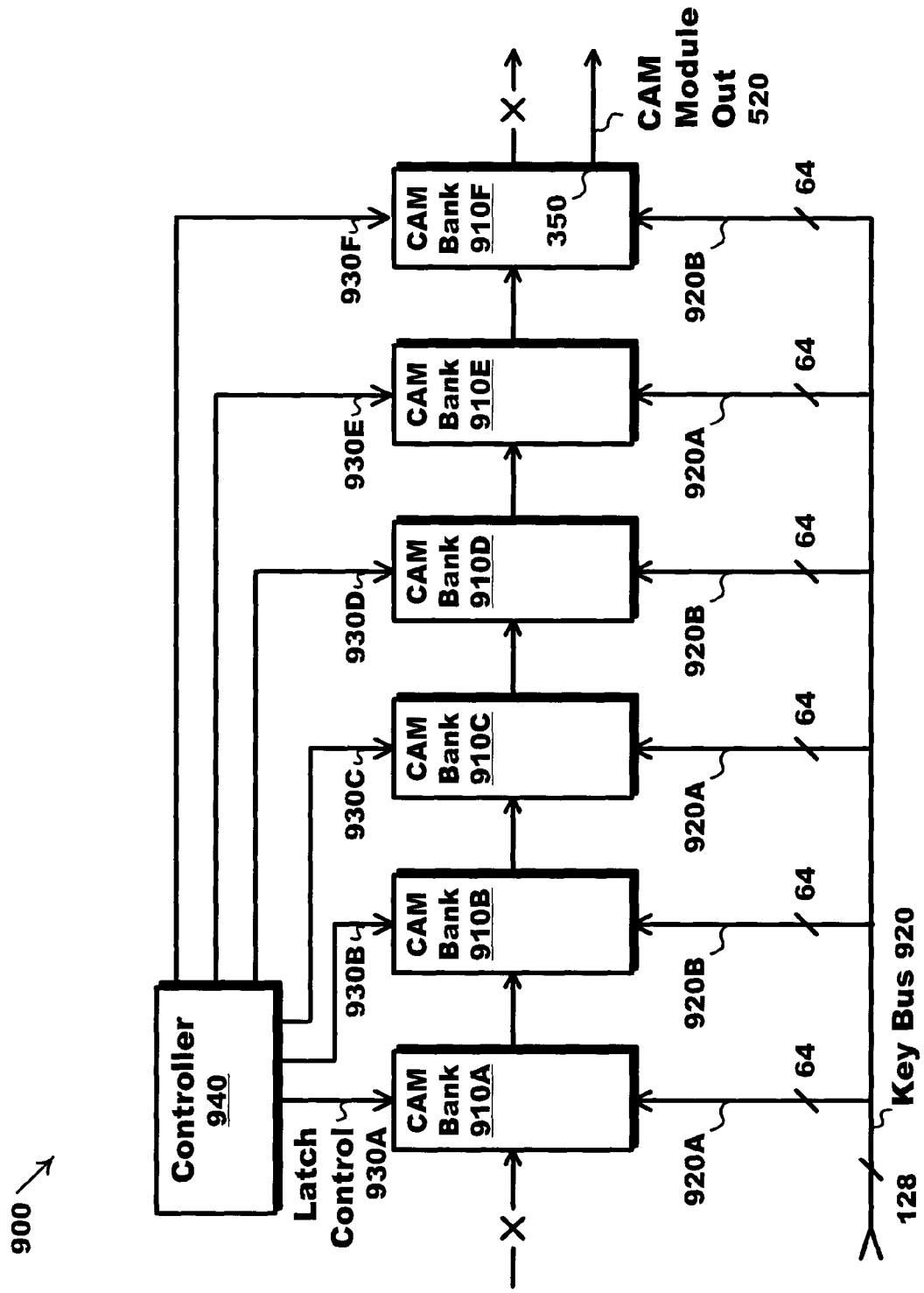
FIG. 9 shows another example of the invention in which CAM banks are configured to operate together as a single CAM module having a four-phase lookup operation.

FIG. 9 is a functional block diagram of a dynamically configurable, CAM module according to an embodiment of the invention having a four-phase lookup operation. CAM module 900 includes six 64-bit CAM banks 910A to 910F, controller 940, and 128-bit key bus 920.

CAM banks 910 function similarly to CAM banks 300, except that the control circuit used within each CAM bank latches the match-out signals under the control of the latch-control signal 930 provided to that bank. When the latch-control signal is asserted, then the match-out signals are latched. The latched match-out signals are then provided to the next CAM bank in the series and are used to generate the encoding-request signals that drive the priority encoder within the CAM bank.

Each CAM bank 910 holds 64-bit entry fields and receives a 64-bit key field. CAM module 900 is configured to hold entries and receive keys that are 384 bits wide; however, key bus 920 is only 128 bits wide.

Such a situation may arise because CAM module 900 is contained in an integrated circuit that has only 128 pins available for key data that originates outside of the circuit. Such a situation may also arise due to timing constraints, for example, the time required for the field-match signals to be generated among the CAM cells within a row within a CAM bank, or the time required for the match-in and match-out signals to propagate among CAM banks, or both.

Controller 940 divides each lookup operation into four phases. In phase one, the first 128 bits of the key are provided to CAM module 900 via key bus 920. Specifically, bits 0 to 63 of the key value are provided to CAM bank 910A via section 920A of key bus 920 and bits 64 to 127 of the key value are provided to CAM bank 910B via section 920B of key bus 920. After enough time has elapsed to ensure that valid match-out signals have arrived at the latches within the control circuit within CAM bank 910B, then controller 940 asserts latch-control signal 930B and these match out signals are latched.

In phase two, the second 128 bits of the key are provided to CAM module 900 via key bus 920. Specifically, bits 128 to 191 of the key value are provided to CAM bank 910C via section 920A of key bus 920 and bits 192 to 255 of the key value are provided to CAM bank 910D via section 920B of key bus 920. After enough time has elapsed to ensure that valid match-out signals have arrived at the latches within the control circuit within CAM bank 910D, then controller 940 asserts latch-control signal 930D and these match out signals are latched.

In phase three, the third and final 128 bits of the key are provided to CAM module 900 via key bus 920. Specifically, bits 256 to 319 of the key value are provided to CAM bank 910E via section 920A of key bus 920 and bits 320 to 383 of the key value are provided to CAM bank 910F via section 920B of key bus 920. After enough time has elapsed to ensure that valid match-out signals have arrived at the latches within the control circuit within CAM bank 910F, then controller 940 asserts latch-control signal 930F and these match out signals are latched.

In phase four, the priority encoder within CAM bank 910F uses the match-out signals latched within the bank to select one of the matching rows (if any) and encode the selected row to form bank-out signal 350, which is also CAM module output signal 520.

Figure 10:
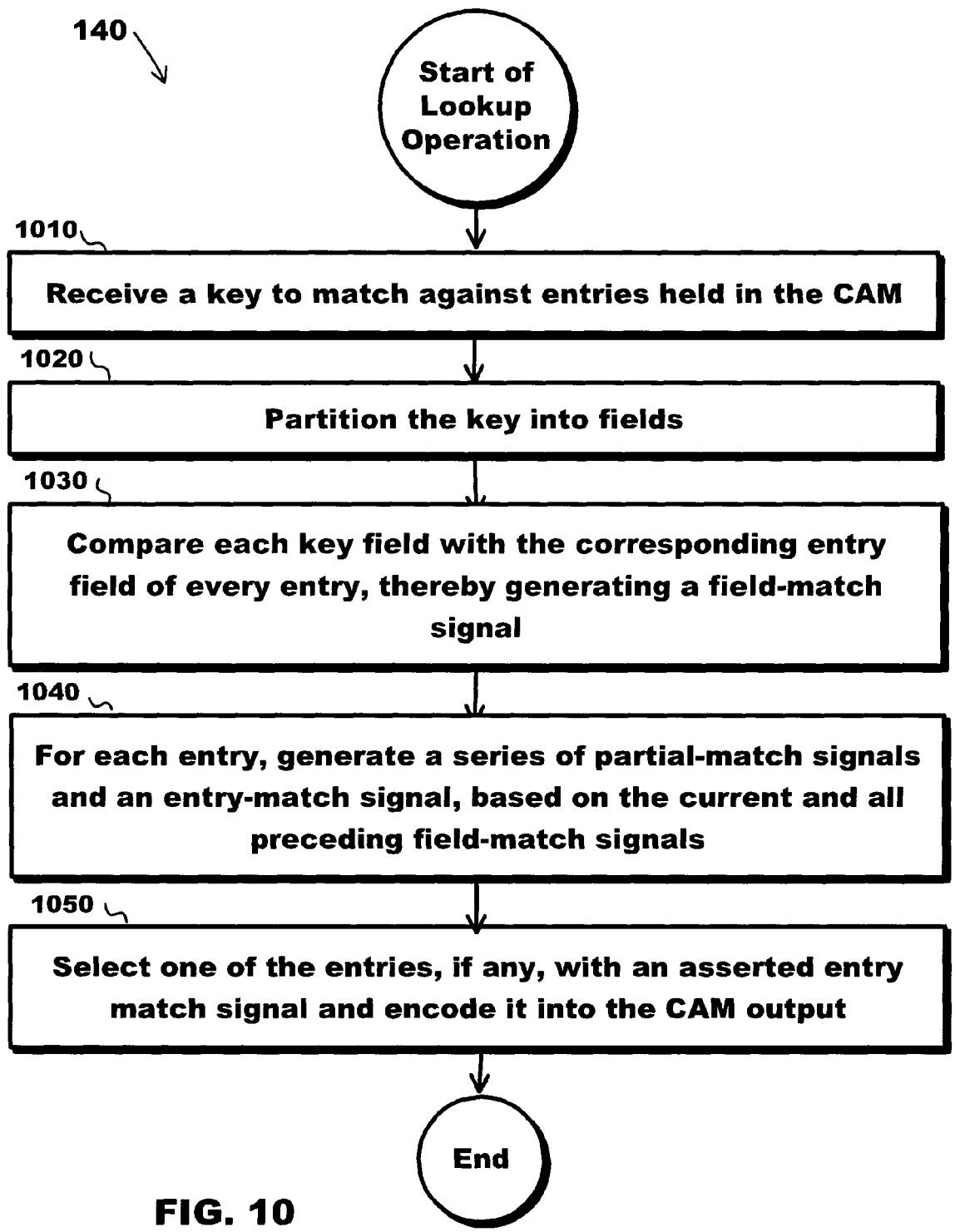
FIG. 10 shows the sequence of operations included in an example lookup operation according to the invention.

FIG. 10 is a flow chart of a lookup operation according to an embodiment of the invention. In FIG. 10, lookup operation 140 is illustrated as a sequence of simpler operations, i.e. operations 1010 to 1050.

In operation 1010, a CAM memory system receives a value for the key. This key value is to be used in this occurrence of the CAM lookup operation. The lookup operation produces an output value based both on the key value and on the entries that are currently held in the CAM system.

In operation 1020, the key value received is partitioned into key fields. Each key field corresponds with one of the CAM banks that form a series of banks within the CAM memory system. Each key field also corresponds with the entry fields that are held in the corresponding CAM bank.

In operation 1030, each CAM bank compares the key field corresponding to that bank with all of the entry fields that are held in that bank. Based on this comparison, a field-match signal is generated for each entry.

In operation 1040, the last CAM bank in the series generates an entry-match signal for each entry, and the other CAM banks generate partial-match signals for each entry. Each entry-match signal and partial-match signal is based both on the field-match signals of the CAM bank that generates the signal and on the field match signals of each preceding bank in the series.

In operation 1050, if one or more entry-match signals are asserted, then one of the entries with an asserted entry-match signal is selected and the selected entry is encoded into the output of the CAM memory system.

The scope of the invention is set forth by the following claims and their legal equivalents. The invention is subject to numerous modifications, variations, selections among alternatives, changes in form, and improvements, in light of the teachings herein, the techniques known to those skilled in the art, and advances in the art yet to be made. The figures and descriptions herein are not intended to be exhaustive or to limit the invention to the designs, forms and embodiments disclosed; rather, they are intended to illustrate the invention by presenting specific details.

The invention claimed is:

1. A content addressable memory (CAM) system for holding entries and receiving a search input that includes a key, the CAM system comprising:
 a series of CAM banks configured according to a corresponding series of link-control signals to form a CAM module wherein the link-control signal is asserted for all but the first CAM bank or only the last CAM bank in the series, each CAM bank including:
  i) a CAM array having rows, each row configured to hold a field from one of the entries, to receive a corresponding field from the key, to determine if the entry field matches the key field, and, if so, to assert a field-match signal; and
  ii) a control circuit configured to receive the field match signal for each row, a match-in signal corresponding to each row, and the link-control signal corresponding to the CAM bank, and to generate based on these a match-out signal for each row;

wherein the match-in signals received by the CAM banks are the match-out signals generated by the corresponding rows within any preceding CAM bank in the series;

wherein, when the link-control signal is being asserted for all but the first CAM bank in the series:
  if the link-control signal is not asserted, the match-out signal generated for each row is then the field-match signal of that row, and
  if the link-control signal is asserted, the match-out signal generated for each row is then asserted only if both the match-in signal and the field-match signal of that row are asserted; and wherein, when the link-control signal is being asserted for only the last CAM bank in the series:
  if the link-control signal is not asserted, the match-out signal generated for each row is then asserted only if both the match-in signal and the field-match signal of that row are asserted, and
  if the link-control signal is asserted, the match-out signal generated for each row is then asserted.

2. The CAM system of claim 1, further comprising:
a priority encoder configured to select a row having a match-out signal that is asserted in the last CAM bank of the series, and configured to encode the selected row into the CAM module output.

3. The CAM system of claim 1, wherein:
each CAM bank further includes a priority encoder configured to select a row with an asserted match-out signal and to encode the selected row into the bank output; and
the bank output of the last CAM bank of the series is the CAM module output.

4. The CAM system of claim 1, wherein:
each CAM bank further includes a priority encoder configured to receive an encoding-enable signal, to enter a reduced power mode when the encoding-enable signal is not asserted, to select a row with an asserted encode-request signal, and to encode the selected row into the bank output when the encoding-enable signal is asserted; and
the bank output of the last CAM bank of the series is the CAM module output.

5. The CAM system of claim 1, wherein:
the control circuit is further configured to receive an encoding-enable signal and to assert an encode-request signal for each row only if both the match-out signal of that row and the encoding-enable signal are asserted;
each CAM bank further includes a priority encoder that is configured to select a row with an encode-request signal that is asserted and to encode the selected row into the bank output when at least one encode request signal is asserted; and
the bank output of the last CAM bank of the series is the CAM module output.

6. The CAM system of claim 5, further comprising:
a configuration register that is configured to hold configuration information and to generate based on the configuration information at least one signal selected from the link-control signal and the encoding-enable signal.

7. The CAM system of claim 5, wherein data that depends on the search input is used to generate at least one signal selected from the link-control signal and the encoding-enable signal.

8. The CAM system of claim 1, further comprising:
at least two priority encoders; and
an interconnect circuit configured to couple to each priority encoder the match-out signals of a selected one of the CAM banks, wherein the interconnection circuit can be configured to select various CAM banks for various priority encoders.

9. The CAM system of claim 8, further comprising:
a configuration register that is configured to hold configuration information and to generate interconnect-control signals based thereon;
wherein the interconnect circuit is further configured to select the CAM banks for the priority encoders based on the interconnect-control signals.

10. The CAM system of claim 8, wherein the interconnect circuit is further configured to select the CAM banks for the priority encoders based on interconnect-control signals that are generated from data that depends on the search input.

11. The CAM system of claim 1, wherein the key field and the entry field are binary, and the rows are further configured to determine that the key field and the entry field match when equal.

12. The CAM system of claim 1, wherein at least one of the key field and the entry field is ternary, and the rows are further configured to determine that the key field and the entry field match when bits selected by a mask within the key field and the entry field are equal.

13. The CAM system of claim 1, wherein the rows are further configurable either to hold a binary entry and to determine that the key field and the entry field match based on a binary determination, or to hold a ternary entry and to determine the key field and the entry field match based on a ternary determination.

14. A method of generating an output value based on entries, where each entry includes entry fields, and each entry field is held in one of a series of CAM banks, the method comprising:
  receiving a search input that includes a key;
  partitioning the key into a series of key fields, wherein each key field corresponds to one of the CAM banks;
  comparing each key field with the entry fields held in the CAM bank that corresponds to the key field;
  generating for each entry and for each CAM bank a field match signal, based on the comparing;
  generating for each entry a series of partial-match signals, wherein the series of partial-match signals corresponds to the series of CAM banks and each partial-match signal represents the status of the field-match signal for the corresponding entry and for the corresponding CAM bank and for any CAM banks that precede the corresponding CAM bank in the series; and
  selecting and encoding an entry whose partial-match signal is asserted by the CAM bank that is last in the series.

15. The method of claim 14, further comprising:
altering which CAM banks that are in the series of CAM banks by writing configuration data into a configuration register.

16. The method of claim 14, further comprising:
altering which CAM banks that are in the series of CAM banks according to data that depends on the search input.

17. The method of claim 14, wherein the partitioning of the key and the comparing of the key occur in at least two phases, each phase involving a different subset of the CAM banks in the series.

* * * * *